(12) United States Patent
Bertin et al.

(10) Patent No.: US 7,394,268 B2
(45) Date of Patent: Jul. 1, 2008

(54) CARRIER FOR TEST, BURN-IN, AND FIRST LEVEL PACKAGING

(75) Inventors: Claude L. Bertin, South Burlington, VT (US); Wayne F. Ellis, Jericho, VT (US); Mark W. Kellogg, Essex Junction, VT (US); William R. Tonti, Essex Junction, VT (US); Jerzy M. Zalesinski, Essex Junction, VT (US); James M. Leas, South Burlington, VT (US); Wayne J. Howell, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 11/531,140

(22) Filed: Sep. 12, 2006

(65) Prior Publication Data

US 2007/0001708 A1    Jan. 4, 2007

Related U.S. Application Data

(62) Division of application No. 09/588,617, filed on Jun. 6, 2000, now Pat. No. 7,132,841.

(51) Int. Cl.
*G01R 31/02* (2006.01)
(52) U.S. Cl. .................................................. 324/754
(58) Field of Classification Search ................. 324/763, 324/765, 158.1, 760; 257/48, 778, 777; 438/14–18
See application file for complete search history.

(56) References Cited

U.S. PATENT DOCUMENTS

| | | | |
|---|---|---|---|
| 3,984,620 A | 10/1976 | Robillard et al. | |
| 4,046,985 A | 9/1977 | Gates | |
| 4,220,917 A | 9/1980 | McMahon, Jr. | |
| 4,386,389 A | 5/1983 | Proebsting | |
| 4,441,075 A | 4/1984 | McMahon | |
| 4,701,781 A | 10/1987 | Sankhagowit | |
| 4,912,547 A | 3/1990 | Bilowith et al. | |
| 4,927,491 A | 5/1990 | Masaki | |
| 4,981,817 A | 1/1991 | Stone, Jr. | |
| 4,996,587 A | 2/1991 | Hinrichsmeyer et al. | |
| 5,047,711 A | 9/1991 | Smith et al. | |
| 5,164,888 A | 11/1992 | Stone, Jr. | |
| 5,173,451 A | 12/1992 | Kinsman et al. | |

(Continued)

OTHER PUBLICATIONS

J.C. Peterson and G. Schrottke, "Optical Flex to Multi-Chip Modules", IBM Technical Disclosure Bulletin vol. 36. No. 12 Dec. 1993.

(Continued)

*Primary Examiner*—Ha Tran Nguyen
*Assistant Examiner*—Tung X. Nguyen
(74) *Attorney, Agent, or Firm*—Connolly Bove Lodge & Hutz LLP; Anthony Canale

(57) ABSTRACT

A plurality of semiconductor devices are provided on a carrier for testing or burning-in. The carrier is then cut up to provide single chip-on-carrier components or multi-chip-on-carrier components. The carrier is used as a first level package for each chip. Thus, the carrier serves a dual purpose for test and burn-in and for packaging. A lead reduction mechanism, such as a built-in self-test engine, can be provided on each chip or on the carrier and is connected to contacts of the carrier for the testing and burn-in steps. The final package after cutting includes at least one known good die and may include an array of chips on the carrier, such as a SIMM or a DIMM. The final package can also be a stack of chips each mounted on a separate carrier. The carriers of the stack are connected to each other through a substrate mounted along a side face of the stack that is electrically connected to a line of pads along an edge of each carrier.

4 Claims, 11 Drawing Sheets

U.S. PATENT DOCUMENTS

| | | |
|---|---|---|
| 5,239,747 A | 8/1993 | Ewers |
| 5,241,266 A | 8/1993 | Ahmad et al. |
| 5,247,248 A * | 9/1993 | Fukunaga ................ 324/760 |
| 5,253,415 A | 10/1993 | Dennis |
| 5,290,710 A | 3/1994 | Haj-Ali-Ahmadi et al. |
| 5,397,997 A | 3/1995 | Tuckerman et al. |
| 5,440,241 A | 8/1995 | King et al. |
| 5,455,518 A | 10/1995 | Sobhani |
| 5,456,404 A | 10/1995 | Robinette, Jr. et al. |
| 5,477,009 A | 12/1995 | Brendecke et al. |
| 5,483,174 A | 1/1996 | Hembree et al. |
| 5,495,179 A | 2/1996 | Wood et al. |
| 5,532,612 A | 7/1996 | Liang |
| 5,532,614 A | 7/1996 | Chiu |
| 5,534,786 A | 7/1996 | Kaneko |
| 5,594,626 A | 1/1997 | Rostoker et al. |
| 5,634,267 A | 6/1997 | Farnworth et al. |
| 5,656,945 A | 8/1997 | Cain |
| 5,661,086 A | 8/1997 | Nakashima et al. |
| 5,677,203 A | 10/1997 | Rates |
| 5,678,301 A | 10/1997 | Gochnour et al. |
| 5,682,064 A | 10/1997 | Atkins et al. |
| 5,686,318 A | 11/1997 | Farnworth et al. |
| 5,686,843 A | 11/1997 | Beilstein, Jr. et al. |
| 5,777,484 A | 7/1998 | Woith et al. |
| 5,894,218 A | 4/1999 | Farnworth |
| 5,945,834 A | 8/1999 | Nakata |
| 6,002,178 A * | 12/1999 | Lin ........................... 257/778 |
| 6,046,600 A | 4/2000 | Whetsel |
| 6,504,389 B1 | 1/2003 | Hembree |
| 6,791,171 B2 | 9/2004 | Mok et al. |
| 6,822,469 B1 * | 11/2004 | Kline ........................ 324/765 |

OTHER PUBLICATIONS

J.C. Peterson and G. Schrottke, "Flex Interconnect to Multi-Chip Modules", IBM Technical Disclosure Bulletin vol. 36 No. 12 Dec. 1993.

R.H. Katyl and R.J. Kelleher, "Burn-In Methodology for Tab Using Separate Signal Carrier Tape", IBM Technical Disclosure Bulletin vol. 32 No. 1 Jun. 1989.

* cited by examiner

CARRIER FOR TEST, BURN-IN, AND FIRST LEVEL PACKAGING

CROSS-REFERENCE TO RELATED APPLICATIONS

This application is a divisional application under 35 U.S.C. 121 of U.S. patent application Ser. No. 09/588,617, filed on Jun. 6, 2000 now U.S. Pat. No. 7,132,841, the entire contents of which are incorporated herein by reference.

BACKGROUND

The present invention relates to an improved method of semiconductor testing, burning-in, and packaging.

Both standard module burn-in and wafer burn-in schemes are wasteful of time space and resource. Module burn-in requires dicing, bond, assembly, and test before burn-in, adding considerable expense to modules that fail burn-in. Wafer burn-in permits burn-in before dicing, saving the packaging cost for failing chips, but it obviously requires the inclusion of the failing chips on the wafer in the burn-in apparatus. Provision must then be provided for disconnecting shorted chips or handling very high currents while providing voltage uniformity. Thus, wafer burn-in is most cost effective for high yielding wafers.

Chip or die burn-in schemes like IBM's R3 process and TI's Diemate process avoid the packaging steps required by module burn-in. Only tested bare chips are burned-in. The R3 process permits simultaneous burn-in of a large array of chips. The chips are solder bump mounted on a ceramic substrate which can be reused a number of times. This provides advantage over the Diemate process which burns in only one chip at a time in each fixture. But the cost of the R3 process can still be expensive since the substrate can only be reused about ten or twenty times. And there is substantial cost for aligning and attaching chips to the substrate and then for removing them and preparing them for reattaching to a final substrate once burn-in is complete. Therefore the cost of producing known good die with module burn-in, wafer burn-in, the R3 process, or the Diemate process can be quite high. Thus, a better solution for test and burn-in is needed that lowers the cost, and that solution is provided by this invention.

SUMMARY

The present invention provides a method for manufacturing and testing semiconductor components that combines testing, burning-in, and packaging. The method includes the step of providing a plurality of semiconductor devices and a device carrier. The carrier has interconnect wiring therein sufficient for both testing and end use operation of the semiconductor devices. The semiconductor devices are attached to the carrier. The devices are then tested via the wiring in the carrier. The carrier is then divided up into a plurality of components such that each component contains at least one semiconductor device. Those components, including the carrier are used as the first packaging level of assembly.

In another aspect, the invention provides a semiconductor structure comprising a device carrier. The carrier has interconnect wiring therein sufficient for both testing and end use operation of the semiconductor devices. A plurality of semiconductor devices are mounted to the carrier. The devices on the carrier may be tested and burned-in and the carrier may be divided into a plurality of components, and the components may be installed in an information handling system without separating the devices from the carrier.

In another aspect, the invention provides a semiconductor structure comprising a stack of flex device carriers. At least one semiconductor device is mounted to each of the flex carriers. Each of the flex device carriers is in turn connected to an interconnect substrate to interconnect the devices. The substrate can be used for external connection or for connection to an additional chip or chips.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIG. 13b is a side view of the stack of chips of FIG. 13a.

DETAILED DESCRIPTION

Figure 1A:
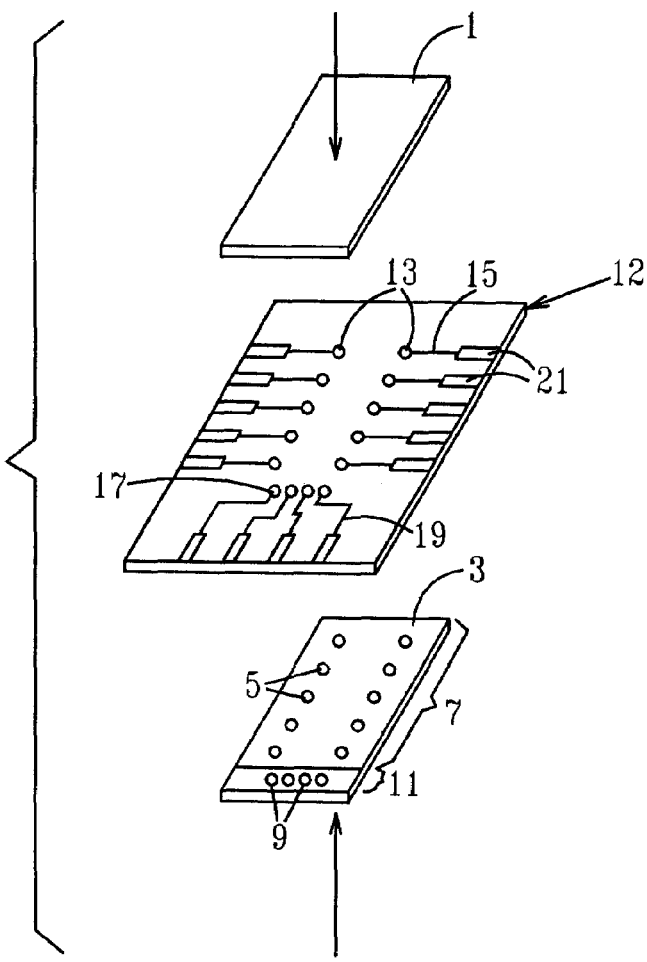
FIG. 1a is an exploded perspective view of two chips mounted on a carrier that is used for test, burn-in and packaging.

As performance of semiconductor chips increases, testing and burn-in and the above-discussed problems may find even greater significance. Along these lines, there is a push for high performance logic and memory chips. Low inductance connections to DRAM chips, for example, are desired to achieve high performance, along the lines of about 200 MHz to about 500 MHz or greater. Thin small outline packages (TSOP) and small outline J-lead (SOJ) packages typically have inductances ranging from about 5 to about 9 nanohenries (nh). Flip-chip packages with solder bumps, such as C4, stud bumps, and others, have inductances of less than about 0.5 nh, and these chips are finding increasing use in the industry. Burn-in is costly for solder bump attached chips. Wafer level burn-in and temporary chip attach (TCA) approaches to test and burn-in are expensive.

The present invention provides a new approach to the die or chip burn-in process. An array of chips are mounted on a carrier for test and burn-in. The carrier is then divided up and used as the final substrate for packaging. Advantages of the present invention include providing a low cost solution for burning-in and packaging chips by combining the burn-in substrate and the final substrate. Along these lines, a burn-in "vehicle" according to the present invention may be later reused as-is to become a final package. The package may contain single chips, stacked chips or an array of chips or stacked chips. The package may be a chip scale package.

Several additional advantages are inherent in the present invention. Redundancy may be invoked after burn-in. Therefore, fewer chips on multi-chip modules need be replaced after test or burn-in. Further cost reduction and time and material savings can be realized in the elimination of a level of wire bonding. C4 bonding also provides higher performance. Elimination of a level of wire bonding can permit a package according to the present invention to be used at frequencies of 200 MHz and above.

Particularly in the context of memory chips, the present invention can permit a memory product card, such as a SIMM, DIMM, PCMCIA, or other, to be used to carry out a burn-in and a final module test. With a flip-chip DRAM, for example, both burn-in and final testing may be carried out on the same card. Attach techniques according to the present invention permit carrying out of several reworks to permit replacement for DRAM chip fallout during burn-in and final card test. The attach techniques further permit card repair due to failure in a computer after installation of the card in the computer.

While the present invention works with flip-chips, it also works with chips mounted with other techniques. For example, the present invention may be used with wire bond mounted bare dies. The present invention may also be used with chip scale packages (CSP) and TSOP/SOJ modules if there is a rework process for detaching and re-attaching modules to a SIMM or other memory card.

Broadly, a method according to the present invention includes providing at least one semiconductor device on a semiconductor carrier. Typically, a plurality of semiconductor devices are attached to the carrier. The semiconductor devices may be memory chips, logic chips, or other semiconductor devices. Along these lines, the present invention may be used with any semiconductor device that is attached to a substrate for carrying out processing, such as burning-in and testing.

According to the present invention, the testing circuitry may be built in to the chips. Along these lines, each chip may have a built in self test (BIST) engine incorporated into its design. The BIST engines may include a wide range of capabilities. For example, by including a BIST engine, a memory chip may be tested at speed, with the exception of receivers and drivers, which may be tested as part of the performance of a card assembly. However, it is not necessary that a chip include a BIST engine. The test engine can be included on the carrier as a separate device from the chips being tested. The test engines could also be located on a separate card. Alternatively, test signals and patterns can be generated by an external tester.

A simple BIST engine can provide patterns for burn-in and for final chip testing at speed. The testing may be extensive, testing for functionality, sensitivities, and other characteristics. The testing may be performed before wafer level fuse blowing, bumping and dicing. A simple BIST engine may be very small, the chip area increases by about 3% or less to accommodate the BIST engine. In the future, it is expected that the BIST engine will be incorporated into different kinds of chips, such as DRAM, SRAM, Flash memory, EEPROM, and other types, as a way to reduce cost from test and burn-in.

A more complex BIST engine may include complex patterns or perform redundancy calculations, among other tasks. However, such a BIST engine may have a greater area penalty on the chip than other, simpler BIST engines. Along these lines, the area impact may be greater than about 3%. A productivity penalty may also be associated with the additional functionality.

Figure 11:
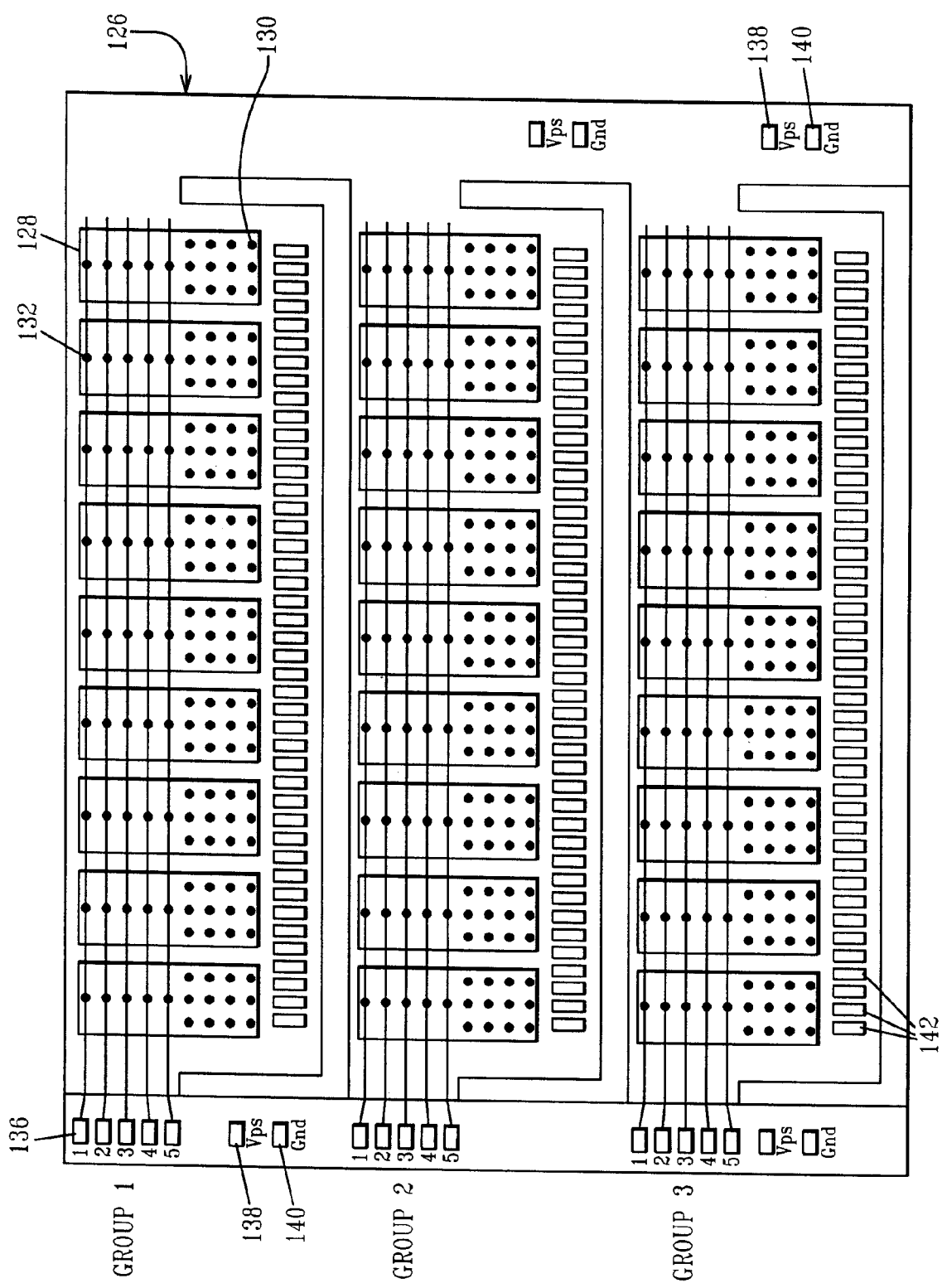
FIG. 11 is an overhead view of another embodiment of a multi-functional carrier according to the present invention.

Additional leads are provided for connecting the BIST engine to signal sources, such as power and ground. According to typical embodiments, a chip may include 5 or 6 extra leads for the BIST engine. However, any number of leads may be included as necessary to accommodate the BIST engine. A carrier that the chips are attached to includes a number of pads corresponding to the number of leads on the chip for the BIST. The pads may be provided for an entire memory card or board or SIMM or other memory structure. The pads permit connection to the BIST leads for test and burn-in. The BIST engines may be connected in series to the extra pads. Alternatively, pads may be provided for separate portions of a memory card or board. For example, pads for a separate BIST engine can be provided for each SIMM or DIMM portion of the card, as shown in FIG. 11.

Providing separate pads and BIST engines for each group of devices on a board would provide greater parallel reading of data from devices during burn-in, and this reduces the overall time needed for burn-in.

The semiconductor devices are attached to the carrier using an attachment scheme such as controlled collapse chip connections (C4), solder columns, wire bonds, or conductive adhesive. C4 connections or other connections may be used to attach chips or other devices to opposite sides of the carrier. The carrier can also have tester chips comprising BIST engines and pads for external connection, such as edge connectors.

FIG. 1a illustrates semiconductor devices in the form of two memory chips 1 and 3 being attached to a carrier. The bottom chip 3 shows C4 connections 5 for a functional portion 7 of the chip. The chip 3 also includes C4 connections 9 for an on-chip BIST engine 11. As stated above, inclusion of the on-chip BIST engine is an option.

In the embodiment shown in FIG. 1a, the carrier 12 is made of polyimide or other equivalent flex carrier material. The carrier can also be made of ceramic FR-4 laminate, or other suitable material. The carrier may have provision for being segmented after testing and burn-in are complete.

The carrier shown in FIG. 1a includes C4 pads 13 for connection to the C4 connections on the chips. Leads 15 are connected to the C4 pads 13 and extend away from the pads. The embodiment of the carrier also includes C4 pads 17 for connection to the C4 connections on the BIST engine on the chips. Leads 19 extend away from C4 pads 17. All of the leads 15 and 19 on the embodiment of the carrier shown in FIG. 1a terminate in a tab 21.

Figure 1B:
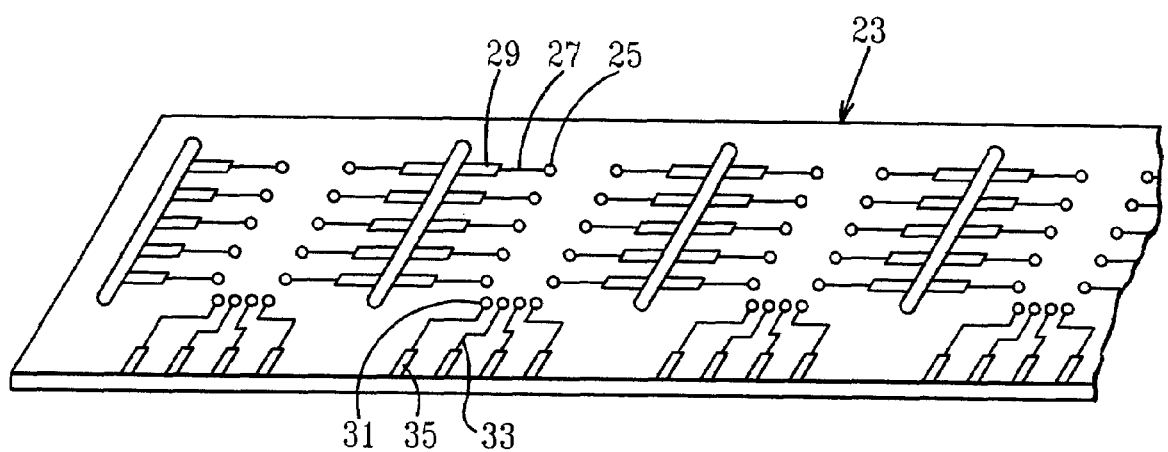
FIG. 1b is a perspective view of another embodiment of a multi-function carrier according to the present invention.

FIG. 1b illustrates another embodiment of a carrier 23 according to the present invention. The carrier 23 shown in FIG. 1b is a flexible mini-ladder carrier that can accommodate a plurality of semiconductor devices thereon. Including multiple sets of chips or other semiconductor devices on one carrier, such as a flexible card, for example the mini-ladder shown in FIGS. 1b, 2a, and 2b, can increase manufacturing efficiency. Along these lines, multiple chips on one carrier can reduce handling and test set-up time and cost, permitting multiple modules to be delivered for testing at one time. This typically is not possible with singulated TSOPs or SOJs.

As such, the carrier 23 includes C4 pads 25 for connecting to C4 connections on the devices to be attached to the carrier. The carrier 23 also includes leads 27 attached to C4 pads 25 and tabs 29 extending from the leads. Also, similar to the embodiment represented in FIG. 1a, the embodiment of the carrier shown in FIG. 1b includes C4 pads 31 for attaching C4 connections of the BIST engines of the attached semiconductor devices. Leads 33, which terminate in tabs 35, extend from pads 31.

Figure 8:
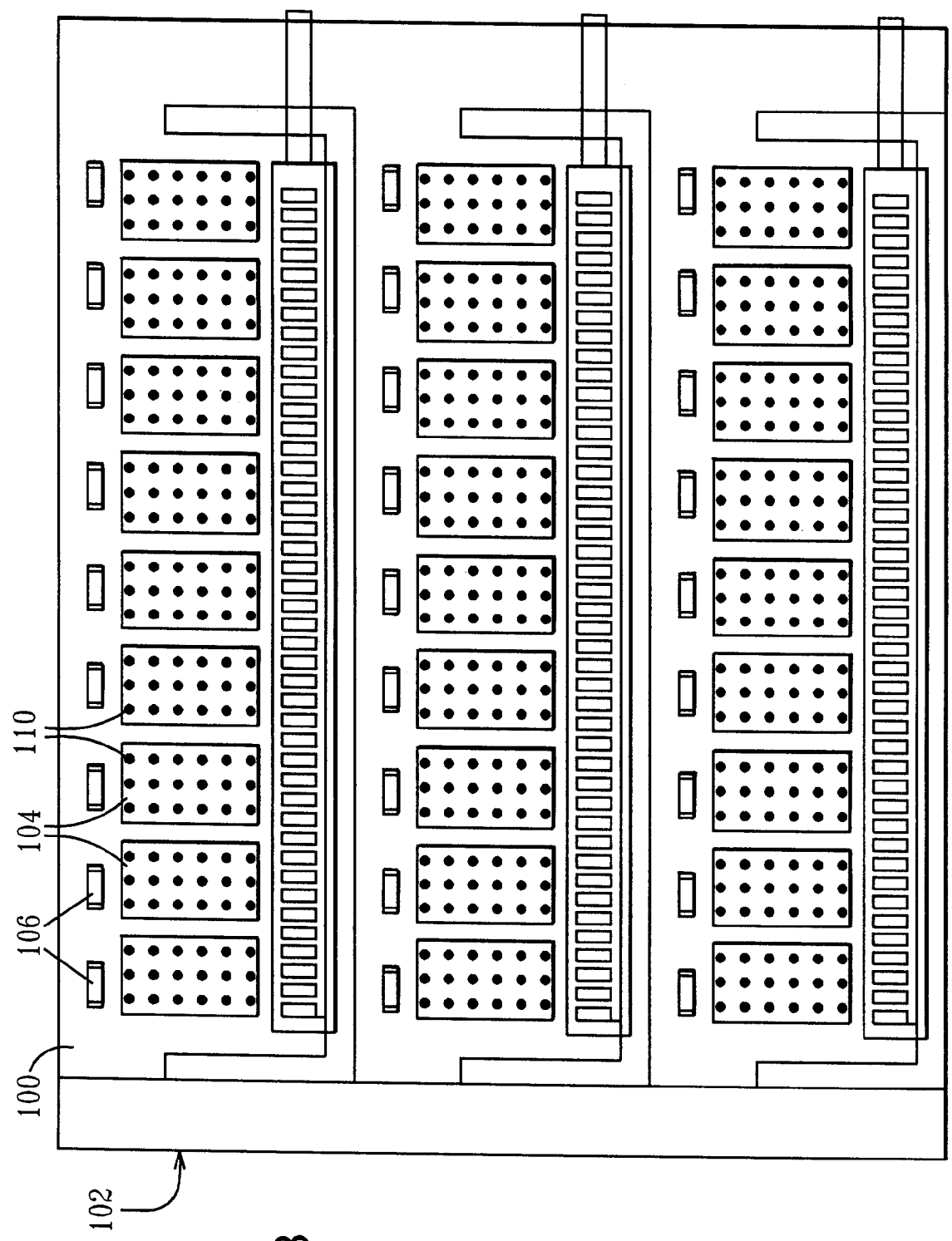
FIG. 8 is an overhead view of another embodiment of a multi-function package according to the present invention.

FIG. 8 illustrates another embodiment of a carrier according to the present invention with attached semiconductor devices. In particular, FIG. 8 shows multiple SIMM's 100 attached to a card 102. Each SIMM includes 9 attached chips 104. The chips 104 are attached with flip-chip attachments. Along these lines, FIG. 8 illustrates solder bumps on each chip 104. If semiconductor devices are attached to both sides of the carrier 102, then 54 flip-chips could be attached to the embodiment of the carrier illustrated in FIG. 8.

A plurality of decoupling capacitors 106 may be provided on a carrier, as shown in FIG. 8. The decoupling capacitors may be used for power supply and ground decoupling on the semiconductor devices attached to the carrier. As such, the capacitors may be available for burn-in and final memory card test of the final assembly. The capacitors may be used for all SIMM or other memory cards.

Figure 9A:
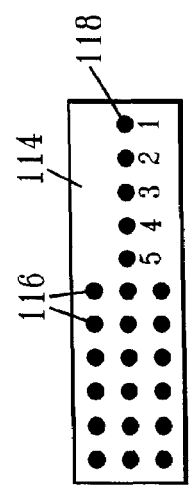
FIG. 9a is a portion of a multi-functional carrier according to the present invention.
Figure 9B:
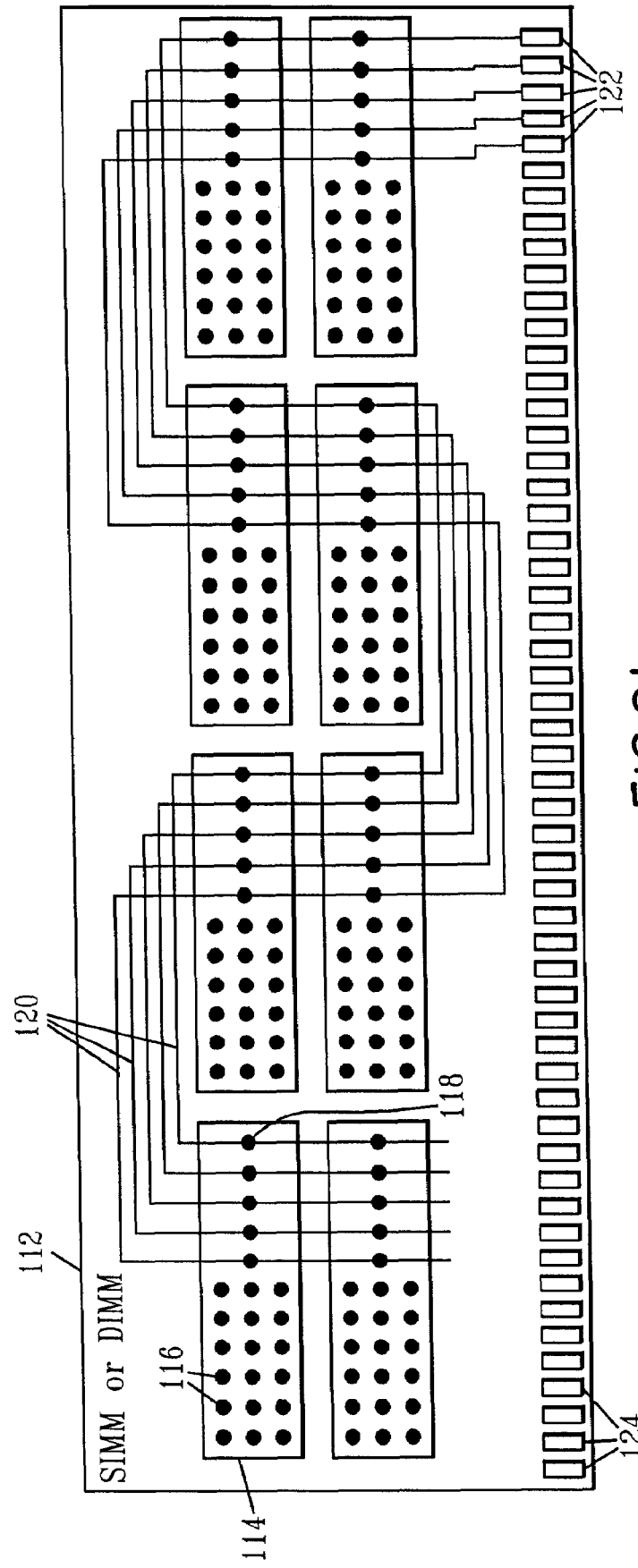
FIG. 9b is an overhead view of another embodiment of a multi-functional carrier according to the present invention.

FIG. 9b illustrates an embodiment of the present invention wherein the attached semiconductor devices each include a BIST engine. Along these lines, FIG. 9b shows a SIMM or DIMM card 112 with attached chips 114. The chips may be memory or logic chips. The chips 114 may be attached to the card with flip-chip connections as evidenced by solder bumps 116.

As previously stated, each chip includes a BIST engine. As such, each chip includes solder bumps 118 for connection of the BIST engines. Less than ten external contacts for making contact to and controlling the BIST engine are needed. These are in addition to the contacts to chip pads that will be used during normal operation of the chip. SIMM or DIMM BIST wiring 120 is included for connecting the BIST engines to BIST connections 122 on the card. The BIST engine includes five connections labeled 1 through 5 on the chip illustrated in FIG. 9a. The BIST engine can include connections for clocks that provide scan in vectors or test patterns and that clock and run the BIST engine. Connections can also be provided for scan-in and scan-out. The semiconductor devices attached to the carrier may be connected in parallel to the external contacts.

The carrier 112 illustrated in FIG. 9b includes a SIMM or DIMM connector 124 at one side of the card.

FIG. 9a illustrates one of the chips shown attached to a carrier 112 shown in FIG. 9b. As previously mentioned, the chip may be a memory or logic chip. The chip shown in FIG. 9a includes the BIST engine. Also, FIG. 9a illustrates the solder connections for connecting the chip to sites on the carrier.

Figure 10:
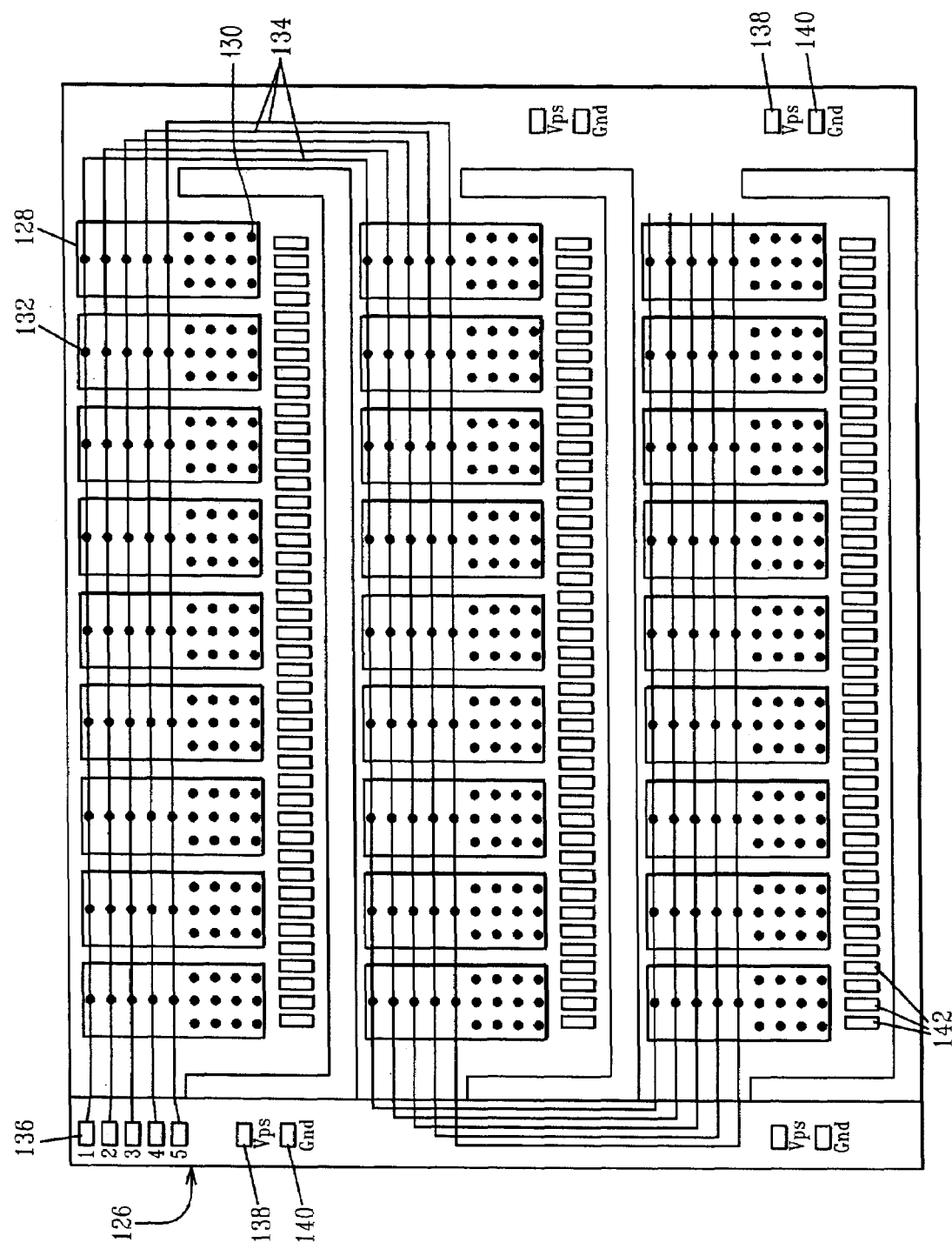
FIG. 10 is an overhead view of another embodiment of a multi-functional carrier according to the present invention.

FIG. 10 illustrates an embodiment of a multi-function package according to the present invention that includes a plurality of semiconductor devices that each includes a BIST engine. Along these lines, FIG. 10 illustrates a carrier 126 with a plurality of chips 128 attached thereto. The chips 128 are attached to the carrier 126 with solder bumps 130.

The BIST engines on each chip are connected to pads 134 on carrier 126 through solder bumps 132 and BIST wiring connectors 134. Additionally, each BIST connector 134 connects the same solder bump on each semiconductor device 130 attached to the carrier, thereby connecting each similar bump 132 on a semiconductor device to one of the BIST pads. As such, corresponding solder bumps on each semiconductor device are connected in common.

The carrier illustrated in FIG. 10 also includes power supply (Vps) connections 138 and ground (Gnd) connections 140. At least one set of voltage and ground connections is provided for each set, in this case each row of semiconductor devices.

Additionally, a set of connectors 142 is also provided for each set of semiconductor devices. Connectors 142 will permit the sets of semiconductor devices to be connected to a computer or in another application after the sets of semiconductor devices are separated. These connectors are similar to the connectors 124 in the embodiment illustrated in FIG. 9b. As can be seen in FIG. 10, the BIST connections are separate from the semiconductor device connections.

In FIG. 10, the three sets of semiconductor devices may each be a SIMM. In other words, FIG. 10 illustrates a three SIMM ladder. In the state illustrated in FIG. 10, there typically is no need to make connection to the SIMM connectors 142 during burn-in and for high speed memory testing. Such an embodiment does not require additional connections on the SIMM.

Assembling multiple sets of semiconductor devices on a single carrier, such as a flexible card, can reduce product handling and set up time and cost. Additionally, multiple modules may be delivered for test at one time.

After connection of one or more semiconductor devices to a carrier, burn-in, testing, be carried out on the semiconductor device(s) attached to the carrier. The burning-in and testing may be carried out on the semiconductor devices simultaneously. Also, the burning-in and testing may or may not be carried out on the semiconductor devices independently of each other.

Carrying out burn-in, testing, and/or other functions typically includes exposing the carrier and attached devices to temperature and voltage conditions necessary for the testing or burn-in. The present invention permits this processing to be carried out on the carrier that will then be installed in a computer or other application. The carrier may be modified as described below prior to final installation.

Figure 2B:
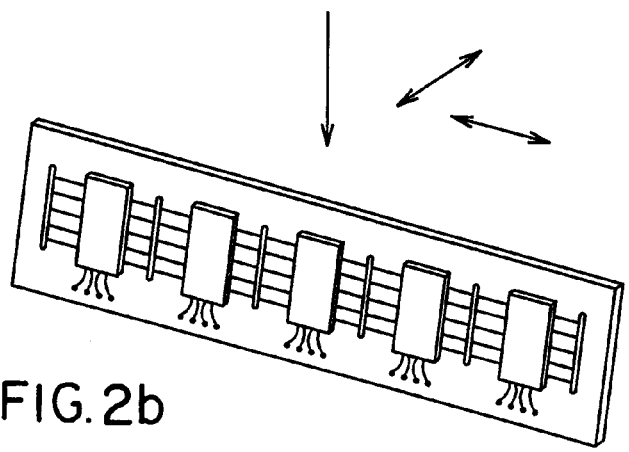
FIG. 2b is a perspective view of the embodiment of a multi-function carrier according to the present invention with a plurality of semiconductor chips attached thereto.
Figure 2A:
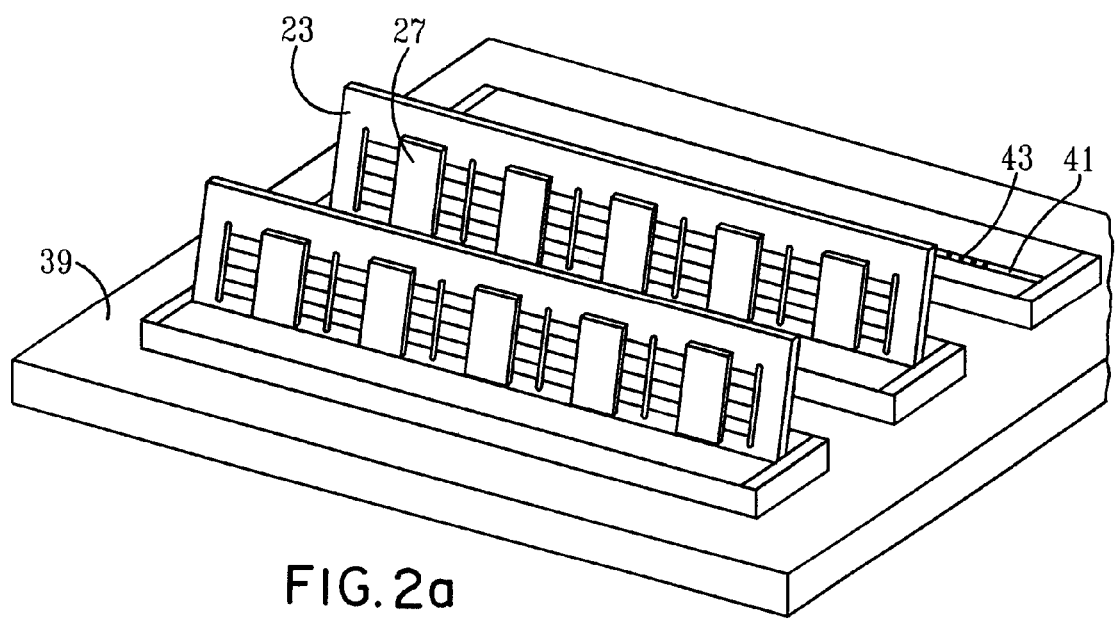
FIG. 2a is a perspective view of a plurality of multi-function carrier according to the present invention engaged in an embodiment of a burn-in tray according to the present invention.

FIG. 2a illustrates an example where carriers 23 with semiconductor devices 37 attached are arranged in a tray 39 for carrying out processing. The embodiment of the tray 39 shown in FIG. 2a is for burn-in and for receiving carriers capable of having attached thereto semiconductor devices that include BIST engines. The tray illustrated in FIG. 2a includes three slots 41 for receiving carriers. FIG. 2b illustrates a carrier in the process of being inserted into one of the slots 41.

The tray includes contacts 43 for contacting the connection leads/tabs on the carrier 23. If no BIST engines were included, standard input/output pads typically are used to make contact for burn-in and testing. Rather than being inserted into a carrier, probes may be attached to the I/O pads for carrying out the burn-in and testing.

Figure 3:
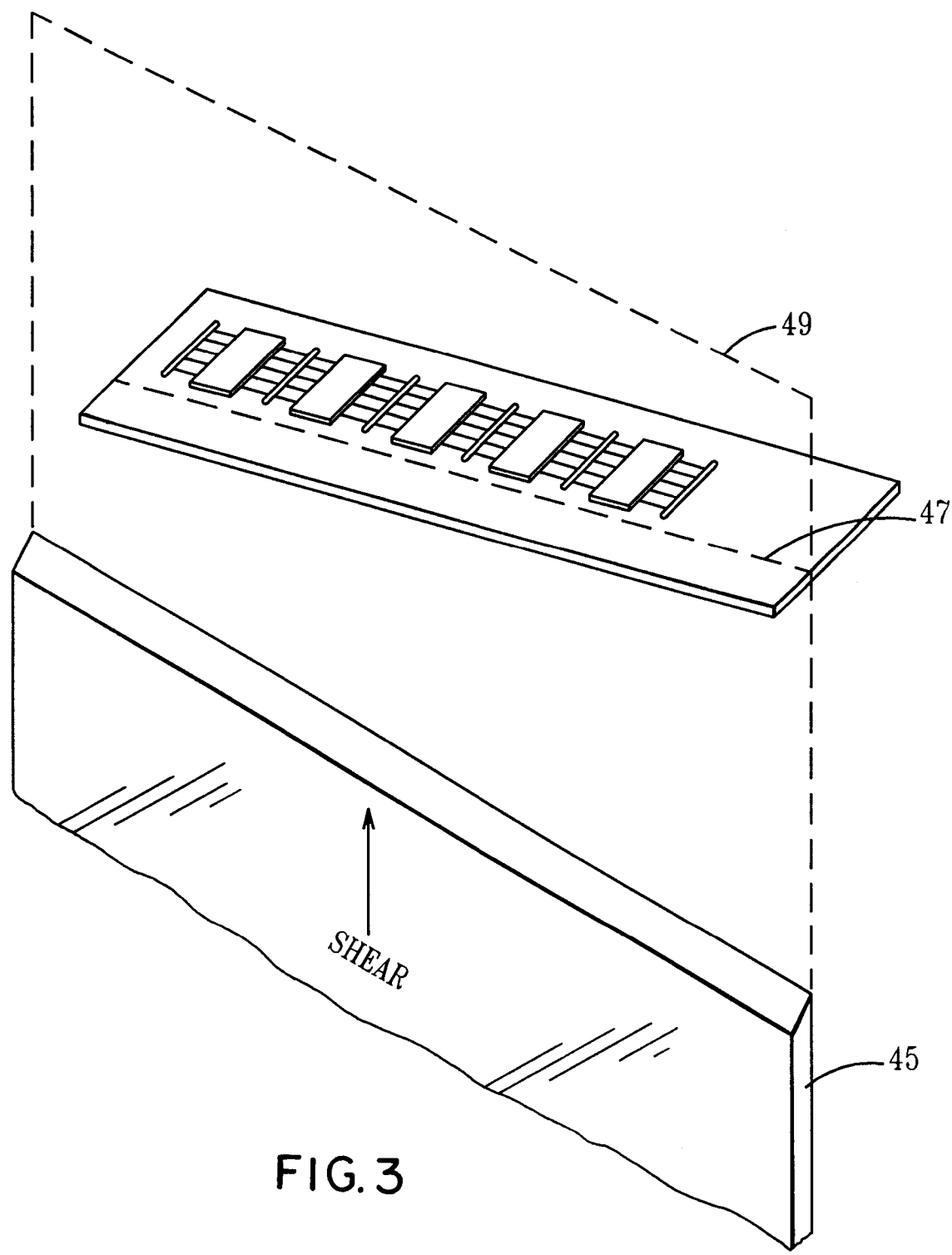
FIG. 3 is a perspective view of an embodiment of a multi-function package according to the present invention illustrating removal of a portion of the carrier subsequent to carrying out processing on the carrier.

After burning-in, a "singulation" process may be carried out. The carrier is cut into individual chips or multi-chip components. If a BIST engine was included as a separate chip on the carrier the portion of the carrier containing the BIST engine can be cut off as well. The carrier is FIG. 3 illustrates this process. In FIG. 3, a blade may be used to cut off a portion of the carrier to provide a multi-chip component. The broken line 47 illustrates where the blade will sever the carrier. Broken line 49 illustrates the final position of the blade 45 after cutting the carrier.

According to the embodiment illustrated in FIGS. 1-3, functional testing may be carried out on singular packages, such as the portion of the carrier remaining after the cutting of the carrier step shown in FIG. 3. Manufacturing efficiency may be enhanced by utilizing mini-ladders, such as that illustrated in FIGS. 1b, 2a, 2b, and 3 if the tester/sorter equipment employed includes trimming and sorting equipment driven by test results. At this time, failing dies on each multi-chip component may be reworked if necessary. If the carrier is cut so as to provide individual dies mounted on carrier, then any carrier pieces having dies that cannot be repaired by invoking redundancy are scrapped. The remainder, having passed test or burn-in, are considered known good die mounted on a first level package.

Flex or microflex may also be used as a carrier to provide a high density array of chips for burn-in. One or two level wiring in the flex connects the chips to large pads on the periphery of the flex for contact during burn-in. Electrically blown fuses may be integrated into one conductive level of the flex to automatically disconnect chips that short during burn-in. The other conductive level of the flex may have thick wiring, from 0.5 to 2 mils thick or thicker, providing a low resistance path so high current at uniform voltage can be provided to all chips. The chips may be mounted to the flex using standard C4 or wire bonds.

Contacts to the large pads on the flex permit testing with a standard burn-in tester. Tester chips may be located on a board near the flex in a lower temperature environment. The tester chips include test circuits and voltage regulators to ensure voltage control and uniformity. Alternatively BIST engines may be provided on each chip. In another alternative, the flex can also include small tester chips with test circuits to provide test signals as described herein. Voltage regulators can also be provided on the flex to ensure that each chip is receiving the correct stress voltage regardless of current drawn, as described in commonly assigned U.S. Pat. No. 5,600,257, incorporated herein by reference.

Preferably, contact pads are located along at least one edge of the flex with wide thick lines for power and ground along with the small number of bused I/O lines needed for testing on one conductive level of the flex. Contact pads can also be located between chips, and these pads can later be used for wire bond connections to the next level of assembly. Alternatively, contact pads can be located on the side of the flex opposite the chips. In this embodiment, each chip on the flex can be separately probed. The pads on the opposite side of the flex can be much larger than chip contact pads. The pads can be used for connection to the next level of assembly, so the flex provides both a burn-in vehicle and a chip scale package.

After burn-in chips are repaired by invoking redundancy by laser blowing fuses. The fuse blow step can also be used to personalize the chip for a specific function. For C4 chips, laser energy is applied through the transparent flex or through a window previously cut in the flex above the fuse bay region on the chip. For wire bond chips the active surface and fuses are accessible directly. Thus, many burn-in fails are easily repaired. The present invention provides significantly enhancement since it takes further advantage of the flex for test, burn-in and fuse blow to repair what would otherwise be burn-in fails. All chips on the flex can then be tested. The flex is then cut or diced to provide individual flex mounted chips. Passing chips, already mounted on flex, are ready for the next level of assembly which can be a lead frame, a PC board, or a chip stack. Thus, chips are preferably not removed from the flex after burn-in; the flex provides significant advantage for a variety of packaging solutions.

The flex burn-in has several advantages over wafer burn-in: chip scale flex burn-in apparatus is significantly lower cost than wafer burn-in apparatus since contact to large pads on the flex eliminates the expensive thermally matched prober needed for wafer burn-in. It also lowers burn-in cost since it has approximately the same chip density as wafer burn-in but only good chips are burned-in. Hence the good chip density can be much higher than available in wafer burn-in. In addition complications from shorted chips are mostly avoided. Shorted chips are thrown away after dicing, are not connected to the flex, and are not burned in (though provision for chips that short during burn-in is provided by fuses included in the flex). Similarly, using a single carrier such as flex for burn-in and packaging is also substantially cheaper than older chip scale burn-in such as the R3 or Diemate methods of chip burn-in which must be followed by a separate packaging step. The result is a known good die or known good multi-dies in a package ready for the next level of assembly.

The scheme has several other advantages as well. It provides a low cost scheme for at-speed test and for burn-in through a low cost first level package. The carrier provides an interface that avoids any need to change chip or wafer design or process for testing an array of chips simultaneously. It provides heavy wiring to provide very large current for parallel test and burn-in of the large array of chips while providing voltage regulators that sense and provide precise voltage at each chip for test. It also provides a way to automatically disconnect shorted chips. The flex provides a low cost scheme for addressing thermal mismatch since flex is compliant. On board self-test engines reduce testing time by providing for parallel test. Programmable self-test engines can also give repair instructions. The scheme is superior to wafer burn-in, particularly for low yield wafers or the early learning portion of a program since only good chips are picked for mounting on the carrier for further test and burn-in. If the test engines are off chip they can be kept out of the hot zone during burn-in, avoiding burning in self-test engines. The known good die resulting from the scheme are ready for dense packaging, such as stacks of chips.

Figure 12:
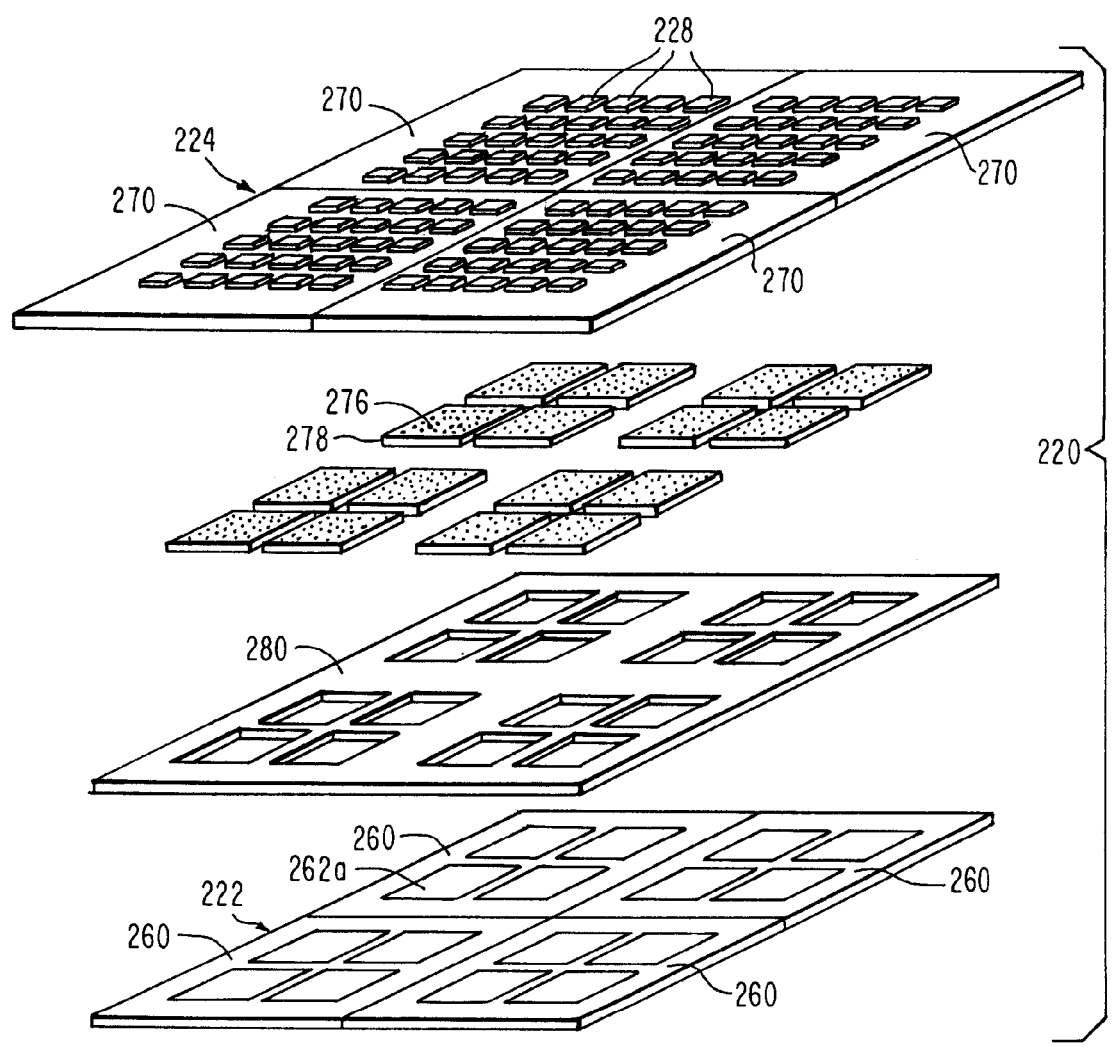
FIG. 12 is a three dimensional view of an arrangement for at-speed testing and burning in of an array of chips involving a flex connector for the array of chips and a second board for providing regulated power to the chips.

One embodiment of a scheme for at-speed wafer test and burn-in is test head 220 shown in FIG. 12. All chips mounted on the bottom surface of flex 222 are contacted with probes 276 extending through plastic housings 278 held in frame 280 that connect pads 262a on flex 222 to pads on second board 224. Second board 224 carries tester chips 228 on its top surface 270, as described in wafer burn-in U.S. Pat. No. 5,600,257, incorporated herein by reference. Second board 224 can be a printed circuit board. Tester chips 228 include (1) tester circuits (BIST) and (2) voltage regulators. In addition to lines extending from the voltage regulators to the chips under test that provide power and ground, the voltage regulators have additional isolated contacts to the chips under test to sense the on-chip voltage of each chip under test. The voltage regulators can then regulate the measured chip voltage to a reference voltage to ensure that the actual chip voltage equals the reference voltage for precise test. Thus, variation in voltage to different chips from variation in current drawn can be eliminated. Voltage regulators can also be used to disconnect or limit current to shorted chips. In this embodiment, second board 224 has thick metallization to carry large currents needed by the voltage regulators on the tester chips and to provide current from the voltage regulators to the chips under test. Second board 224 holding tester chips 228 is generic for all chips in a product family while flex 222 has a contact pad scheme specific for the chips under test.

In this embodiment flex 222 need not have thick wiring to carry large current since second board 224 performs that function. Flex 222 has pads on both sides. Top side 260 of flex 222 has the generic layout needed for contact with second board 224 carrying tester chips 228. Pins 276 are used for connection between the boards The bottom side of flex 222 has pads arranged to mate with pads on the chips under test. In addition, both flex 222 and second board 224 can carry decoupling capacitors needed for the at-speed testing. In this embodiment tester chips may be kept at a lower temperature than chips under test. If BIST engines are provided on each chip under test, the scheme can still be used to provide regulated voltage to each chip.

Figure 13A:
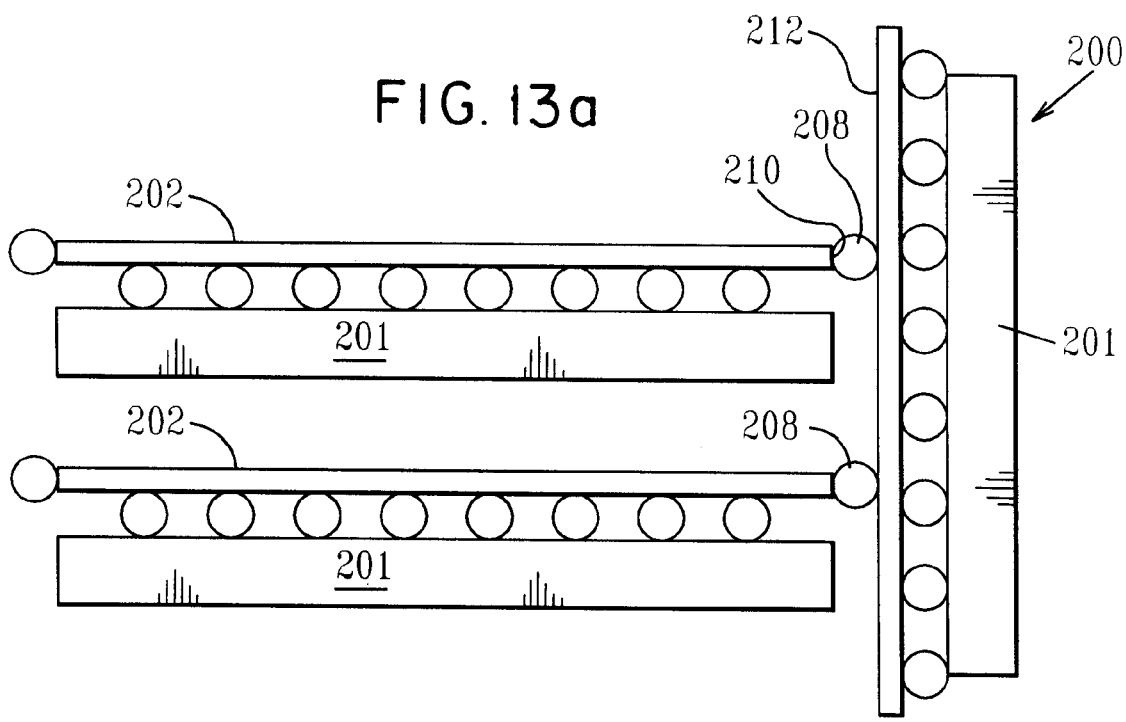
FIG. 13a is a side view of a stack of chips formed by connecting a plurality of components to a substrate.
Figure 13B:
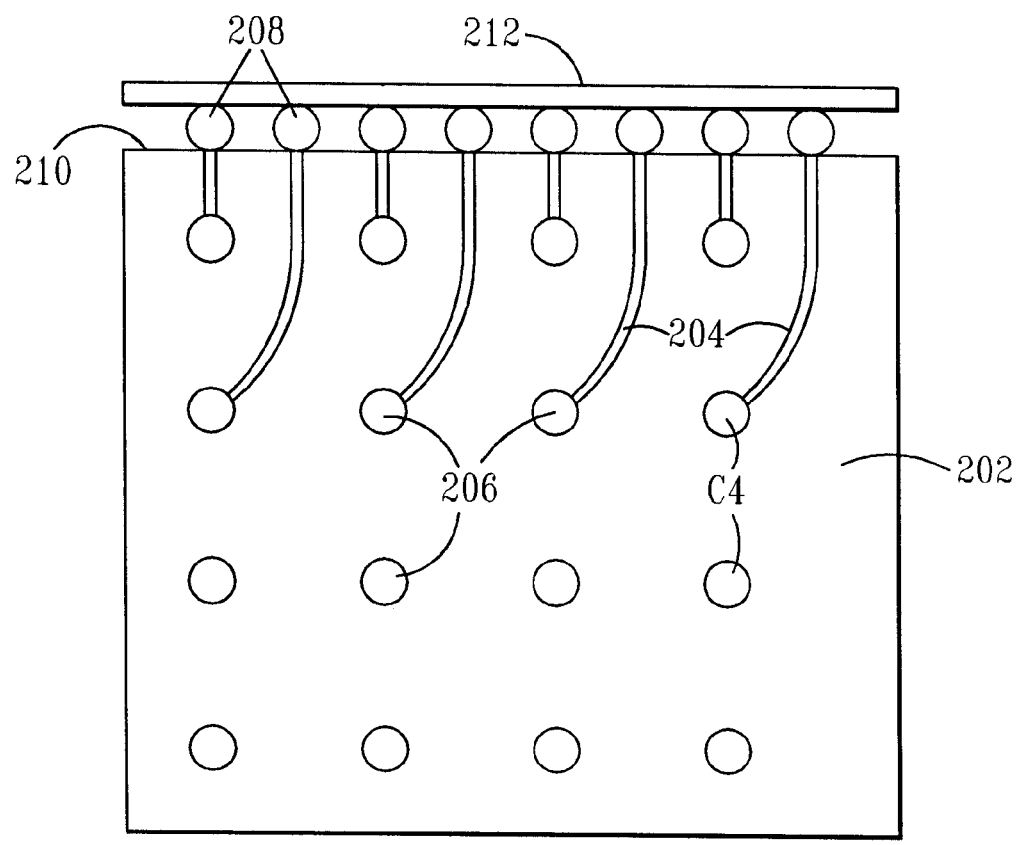

In one embodiment of a packaging scheme, the next level of assembly is compact stack of chips 200, as shown in side and top views in FIGS. 13a, 13b. Stack 200 can be assembled by stacking known good chips 201 mounted on flex 202. Each flex 202 has wiring 204 connecting pads 206 on flex 202 and chip 200 to pads 208 along edge 210 of flex 202. Interconnect substrate 212 is electrically connected to each edge pad 208 to provide interconnection among stacked chips 201. Interconnect substrate 212 can be a flex, PC board, ceramic substrate, or a semiconductor chip. Other chips, such as chip 201', may be mounted to interconnect substrate 212. Interconnect substrate 212 can also have pads 214 for external connection to stack of chips 200. The structure can be used, for example, to provide a large number of memory chips as cache for a microprocessor mounted on interconnect substrate 212. Solder bumps provided by wave soldering can be used at the pads 208 at the end of each wire 204 on flex 202 for connection with interconnect substrate 212. Alternatively, flex 202 can plug into connectors on interconnect substrate 212. Copper plates (not shown) can be provided between flex 202 layers to provide for heat removal. In this stacked arrangement flex 202 and interconnect substrate 212 provide all wiring interconnection among chips of the stack and for external connection without the need to provide any additional wafer or stack processing beyond connecting chips to flex and flex to substrate.

Figure 4:
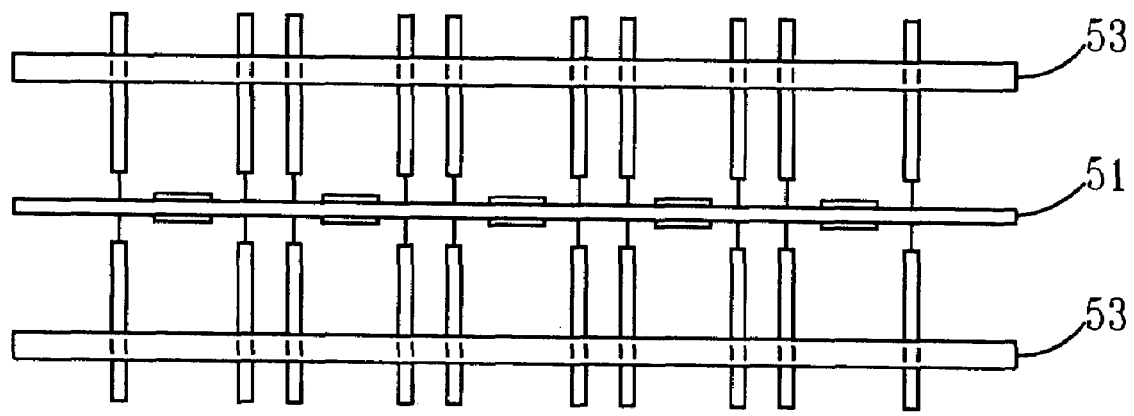
FIG. 4 is a view of another embodiment of a multi-function package according to the present invention.

FIG. 4 illustrates a carrier 51 such as that shown in FIGS. 1-3 in the process of undergoing a functionality test. The carrier is being contacted by a po-go array 53. The po-go array contacts the contact regions on the carrier that extend from the connections pads on the carrier that the chips are attached to. The arrangement illustrated in FIG. 4 may also be used for burn-in and testing if the BIST engine is not included on the chips or not used.

Figure 5:
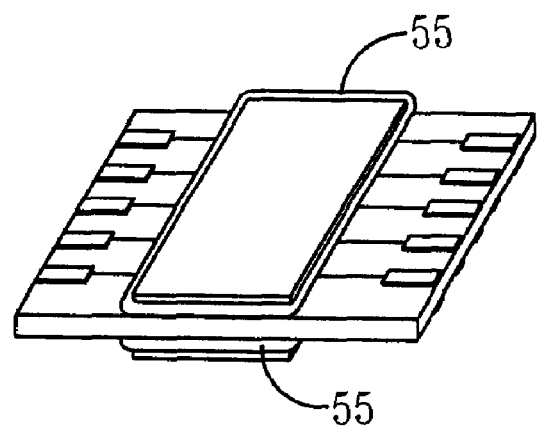
FIG. 5 is a perspective view of another embodiment of a multi-function package according to the present invention, including encapsulant about the semiconductor chips.

After burn-in and testing, the chips may be encapsulated. Encapsulation may be accomplished by placing a conformal coating all around the edges of the chips. The coating may be on both sides of the carrier if chips are attached to both sides. FIG. 5 illustrates a portion of a carrier with a coating 55 around the chips on the carrier.

Figure 6:
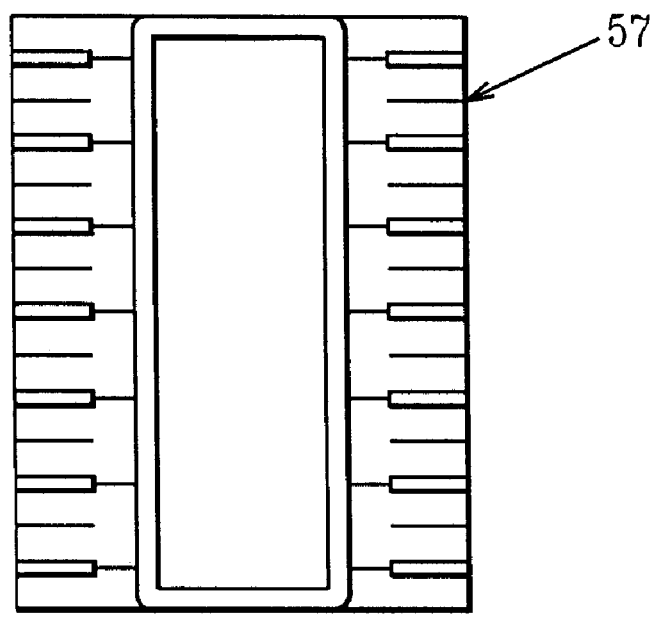
FIG. 6 is an overhead view of the embodiment of a multifunction package shown in FIG. 5, illustrating cutting of the package.

Portions of the carrier with individual chips may be separated from each other prior to or after the encapsulation. The carrier may be cut utilizing any suitable method and apparatus. FIG. 6 illustrates a portion of the carrier with a chip attached. A chip may also be attached to the other side of the portion of the carrier shown in FIG. 6.

Any embodiment of the present invention may also include a temporary cover for covering the chips during handling for burning-in and testing. Permanent covering or encapsulation may then be placed on the carrier for more permanent protection.

To attach the flex to another carrier, such as a printed circuit board, in a manner similar to the attachment of a standard surface mount component, such as a lead frame or TSOP, it is desirable to separate the leads in the attachment region so they simulate the leads of a lead frame or TSOP. FIG. 6 illustrates locations 57 where the carrier may be cut. The portions of the carrier shown in FIG. 6 may then be incorporated into another structure.

Figure 7:
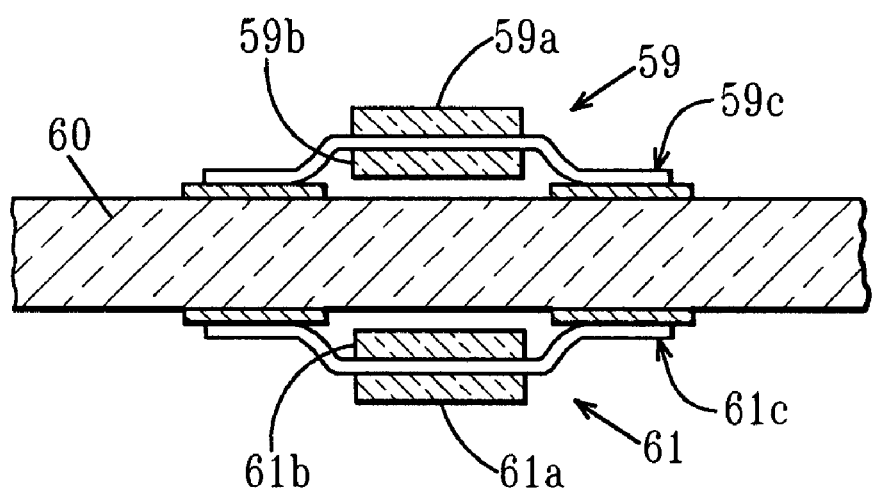
FIG. 7 is a cross-sectional view of another embodiment of a multi-function package according to the present invention.

FIG. 7 illustrates two carrier portions 59 and 61 attached to the surface of a substrate 60. Any substrate may be used to attach the carrier portions 59 and 61 to. According to one example, an FR-4 carrier may be used. Other examples include ceramic carriers and organic or other laminate carriers. Each carrier portion 59 and 61 has chips 59a and 59b and 61a and 61b attached thereto. The leads and tabs 59c and 61c portions of the carrier portions 59 and 61 are actually attached to the substrate 60. It is not necessary that a carrier portion be attached to both sides of the substrate.

The embodiment of the present invention illustrated in FIGS. 8-10 undergoes similar processing to that described above. An embodiment of the present invention illustrated in FIG. 8 could be placed in a burn-in oven with connections (not shown) to each connector on the carrier. The devices, SIMM's in this case, may be monitored in situ during burn-in. During this time, failing modules are identified. Burn-in fallout for a mature program may be about 1% to about 2%. Chips falling out are replaced prior to shipment of the SIMM to a customer. As stated above, one of the advantages of the present invention is that the chips may be burned-in and shipped without being detached from the carrier, except for failing chips, which are replaced.

For an embodiment of the present invention, such as that illustrated in FIGS. 9a and 10, which include BIST engines, the burn-in and test sequence may be as follows. A wafer level test and fuse blow may be carried out. Good chips may be picked and connected to the carrier, such as a SIMM, DIMM, PCMCIA or other memory card, by C4 connections. A pre-burn-in test may then be carried out using the BIST engines, if required.

Next, the carriers and attached chips may be place in a burn-in chamber. The chips may be put in a burn-in mode using initialization program (IP) codes. The BIST engines can supply the patterns and record failures of the chips.

All chips attached to the carrier(s) receive the full insitu burn-in cycle including 140° C. reliability stressing, 85° C. sensitivity testing and temperature ramp-up/ramp-down exposure tests. During the testing, all chips operate in parallel. At the end of the testing, the BIST engine chains are read out. The chains identify failing chip locations. In addition, the full assembly of chips and carriers can then be tested at full function and speed after burn-in is complete using the BIST engine and/or using memory function tests applied to the connectors on the carriers. Data for both the burn-in and memory testing may be combined. Failing chips may then be replaced with good chips in a rework step.

Preferably, chips used to replace the failed chips in the rework step are fully burned-in and tested chips from another card. After replacement with previously burned-in chips, only a final test of the memory card is needed.

Alternatively, the memory chips used to replace failed chips in the rework cycle may be new, non-burned-in chips. In this embodiment of the present invention, the memory assembly may again be placed in a burn-in oven and retested after burn-in is complete.

Replacement and reburn-in are not required if the carrier is singulated into single chip components. Failing components are discarded, and passing components are identified as known good die.

Once all chips are identified as good using the BIST engines, a final memory application function may be tested at speed. Such testing typically does not employ the BIST engine. The BIST engines may be used to test all memory chips on a memory card, at speed, in parallel, except for the final test in chip receivers and drivers, which may be tested as part of the final assembly. After any final testing, the product may then be shipped to customers.

Memory chips attached to a carrier according to the present invention may be tested at full functional speed using the BIST engines. The BIST engines can be used in the system as part of the system diagnostics when system memory fails if included as part of the SIMM system design. A system can identify a bad memory chip or chips and send data along with the SIMM, DIMM, or other memory assembly to the factory. The system can test spare chips on the memory card using the BIST engine and then substitute good chips for bad chips in the system. The checking and substitution can be transparent to the application.

The present invention can provide a relatively simple, portable system for carrying out field tests, burn-in and repair for systems that include memory chips that include BIST engines and access to the BIST engines. Although the above example includes DRAM's, the system will work with SRAM's, logic with memory macros, logic, EEPROM, flash, and other applications.

To enhance the thermal properties of a multi-function assembly according to the present invention, a copper backing sheet may be added to the carrier. The copper backing sheet may be attached to an external heat sink and/or fins. The copper backing sheet may also or alternatively be attached to a printed circuit board (pcb) that the carrier is attached to. Thermal management may also be accomplished by removing heat from sides of a carrier not used for electrical connection.

Other enhancements that may be made to the carriers described above include providing for electrical connection to more than one side of a chip. This technique may be used to segregate next level assembly interconnection from burn-in and test interconnection.

A window can be provided in the flex to enable accessing fuses for fuse blow or fuse testing. Because the fuses remain accessible through the window, the structure allows invoking redundancy and blowing fuses after burn-in is complete to repair defects produced by burn-in. For C4 mounted chips, a window may be present in a carrier, such as a flex, that the chips are mounted to for access to a portion of the active surface of the chip, such as fuse bays. A window can also enable providing a chip-on-chip structure, in which the smaller chip is located in the window in the flex. For wire bond and flip chips the active surface and fuse bays may be accessible. In such cases, an opening or "window" may exist in the chip carrier that permits access to active regions of a chip. This can permit use of laser or other tools to modify circuitry, such as via fuses. The capability to invoke redundancy post burn-in can result in significantly higher product yield and lower cost.

A flex carrier may be used to personalize a chip. Along these lines, utilizing selective laser deletion on the flex, changes can be effected on chip function. This can be accomplished at the same time that chip fuse laser deletion is carried out.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A semiconductor structure comprising:
    a stack of flex device carriers, wherein at least one semiconductor device is mounted to each said flex device carrier; and
    an interconnect substrate,
    wherein said flex device carriers are electrically connected to said interconnect substrate, and
    wherein each said flex device carrier comprises contacts for external connection, said structure further comprising a lead reduction mechanism on each said flex device carrier, said lead reduction mechanism connected to said contacts of said flex device carrier.

2. The semiconductor structure of claim 1, wherein said stack of flex device carriers, said at least one semiconductor device, and said interconnect substrate are interconnected and arranged in a manner suitable for both operational testing and packaging of the semiconductor structure.

3. The semiconductor structure of claim 1, wherein each said flex device carrier is arranged to be divided into a plurality of components, and wherein said plurality of components are arranged so as to be suitably installed in an information handling system without separating said at least one semiconductor device from said flex device carrier.

4. The semiconductor structure of claim 1, wherein each said flex device carrier comprises interconnect wiring therein sufficient for both testing and packaging of said at least one semiconductor device.

* * * * *